(12) United States Patent
Cheng et al.

(10) Patent No.: US 11,533,811 B2
(45) Date of Patent: Dec. 20, 2022

(54) ELECTRONIC DEVICE

(71) Applicant: Au Optronics Corporation, Hsinchu (TW)

(72) Inventors: Yun Cheng, Hsinchu (TW); Hao-An Chuang, Hsinchu (TW); Hsi-Hung Chen, Hsinchu (TW); Chun-Yueh Hou, Hsinchu (TW); Fan-Yu Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/369,914

(22) Filed: Jul. 7, 2021

(65) Prior Publication Data

US 2022/0053646 A1 Feb. 17, 2022

Related U.S. Application Data

(60) Provisional application No. 63/065,641, filed on Aug. 14, 2020.

(30) Foreign Application Priority Data

Mar. 3, 2021 (TW) ................. 110107470

(51) Int. Cl.
*H05K 3/28* (2006.01)
*H05K 1/11* (2006.01)
(Continued)

(52) U.S. Cl.
CPC ............ *H05K 3/28* (2013.01); *H05K 1/111* (2013.01); *H05K 1/181* (2013.01);
(Continued)

(58) Field of Classification Search
CPC ................ H05K 3/28; H05K 1/0296; H05K 2201/09154
See application file for complete search history.

(56) References Cited

U.S. PATENT DOCUMENTS

| 6,025,901 A | * | 2/2000 | Adachi | ............... G02F 1/13452 |
| | | | | 349/158 |
| 2012/0135181 A1 | * | 5/2012 | Tseng | ..................... B24B 9/065 |
| | | | | 428/81 |

(Continued)

FOREIGN PATENT DOCUMENTS

| CN | 102169252 | 8/2011 |
| CN | 108957878 | 12/2018 |

(Continued)

*Primary Examiner* — Sherman Ng
(74) *Attorney, Agent, or Firm* — JCIPRNET

(57) ABSTRACT

An electronic device includes a substrate, multiple side wires, and a protection structure. The substrate has a first main surface, a side surface, and a first multi-turning surface connected between the first main surface and the side surface. The first multi-turning surface includes multiple first turning surfaces with differing normal directions. The side wires are disposed on the substrate. Each of the side wires extends from the first main surface over the first multi-turning surface to the side surface. The protection structure is disposed on the substrate and includes a wire protection part covering the side wires. The wire protection part has a first thickness at the side surface, a second thickness at the first main surface, and a third thickness at at least one of the first turning surfaces. The first thickness is greater than the second thickness, and the second thickness is greater than the third thickness.

20 Claims, 9 Drawing Sheets

(51) Int. Cl.
*H05K 1/18* (2006.01)
*F21Y 113/10* (2016.01)
*F21Y 115/10* (2016.01)

(52) U.S. Cl.
CPC ........ *F21Y 2113/10* (2016.08); *F21Y 2115/10* (2016.08); *H05K 2201/10106* (2013.01)

(56) References Cited

U.S. PATENT DOCUMENTS

| | | | |
|---|---|---|---|
| 2014/0264785 A1* | 9/2014 | Lin | H01L 23/544 |
| | | | 257/659 |
| 2015/0132531 A1 | 5/2015 | Tseng et al. | |
| 2020/0013803 A1* | 1/2020 | Jang | H01L 51/0036 |
| 2020/0135126 A1* | 4/2020 | Yokoyama | H01L 25/0753 |
| 2020/0203235 A1* | 6/2020 | Jung | H01L 25/167 |
| 2020/0259056 A1* | 8/2020 | Hong | H01L 27/1262 |
| 2021/0135076 A1* | 5/2021 | Jung | H01L 33/62 |

FOREIGN PATENT DOCUMENTS

| | | |
|---|---|---|
| CN | 110211973 | 9/2019 |
| TW | 201913332 | 4/2019 |

* cited by examiner

ELECTRONIC DEVICE

CROSS-REFERENCE TO RELATED APPLICATION

This application claims the priority benefit of U.S. provisional application Ser. No. 63/065,641, filed on Aug. 14, 2020, and Taiwan application serial no. 110107470, filed on Mar. 3, 2021. The entirety of the above-mentioned patent applications is hereby incorporated by reference herein and made a part of this specification.

BACKGROUND

Technical Field

The disclosure relates to a device, and more particularly, to an electronic device.

Description of Related Art

With the advancement and development of technology in the electronics industry, the applications of electronic devices have spanned over many fields to replace conventional products. In terms of display-related electronic devices, designs which accommodate various size requirements by splicing have been proposed. To realize such designs, electronic devices, such as display panels, display devices, etc., are being developed towards configurations with narrow bezels or even no bezels.

SUMMARY

The disclosure provides an electronic device having a narrow bezel design and ideal quality.

An electronic device according to an embodiment of the disclosure includes a substrate, multiple side wires, and a protection structure. The substrate has a first main surface, a side surface, and a first multi-turning surface connected between the first main surface and the side surface. The first multi-turning surface includes multiple first turning surfaces with differing normal directions. The side wires are disposed on the substrate. Each of the side wires extends from the first main surface across the first multi-turning surface to the side surface. The protection structure is disposed on the substrate and includes a wire protection part covering the side wires. The wire protection part has a first thickness at the side surface, has a second thickness at the first main surface, and has a third thickness at at least one of the first turning surfaces. The first thickness is greater than the second thickness, and the second thickness is greater than the third thickness.

In an embodiment of the disclosure, the protection structure further includes a gap protection part extending between the side wires. The gap protection part has a fourth thickness at the side surface, has a fifth thickness at the first main surface, and has a sixth thickness at at least one of the first turning surfaces. The fourth thickness is greater than the fifth thickness, and the fifth thickness is greater than the sixth thickness.

In an embodiment of the disclosure, the second thickness is greater than the fifth thickness.

In an embodiment of the disclosure, the second thickness is greater than the fourth thickness.

In an embodiment of the disclosure, the protection structure is formed by stacking a first protective layer and a second protective layer, and the first protective layer is located between the side wires and the second protective layer.

In an embodiment of the disclosure, the first protective layer covers the side wires, and a contour of the side wires conforms to a contour of the first protective layer.

In an embodiment of the disclosure, the second protective layer includes an overlapping segment and a gap segment. The overlapping segment is stacked on the first protective layer and forms the wire protection part with the first protective layer. The gap segment is located in a gap between the side wires and is in contact with the substrate.

In an embodiment of the disclosure, the second protective layer exposes a portion of the first protective layer on the first main surface.

In an embodiment of the disclosure, the substrate further includes a second main surface and a second multi-turning surface located between the second main surface and the side surface. The second multi-turning surface includes multiple second turning surfaces with differing normal directions.

In an embodiment of the disclosure, each of the side wires extends continuously from the first main surface, passing across the first multi-turning surface, the side surface, and the second multi-turning surface, to the second main surface.

In an embodiment of the disclosure, an intersection point between the first multi-turning surface and the first main surface is away from the side surface by a first lateral distance, an intersection point between the second multi-turning surface and the second main surface is away from the side surface by a second lateral distance, and the first lateral distance is less than the second lateral distance.

In an embodiment of the disclosure, the electronic device further includes a first conductive pad and a second conductive pad. The first conductive pad and the second conductive pad are respectively disposed on the first main surface and the second main surface, and one of the side wires electrically connects the first conductive pad to the second conductive pad.

In an embodiment of the disclosure, the second conductive pad is farther away from the side surface than the first conductive pad.

In an embodiment of the disclosure, a length of the first conductive pad is less than a length of the second conductive pad.

In an embodiment of the disclosure, the electronic device further includes a light-emitting element. The light-emitting element is disposed on the first main surface and spaced apart from the protection structure.

In an embodiment of the disclosure, the electronic device further includes an encapsulation layer to cover the light-emitting element.

In an embodiment of the disclosure, the encapsulation layer further overlaps with a portion of the protection structure on the first main surface.

In an embodiment of the disclosure, the normal directions of the first turning surfaces are between a normal direction of the first main surface and a normal direction of the side surface.

In an embodiment of the disclosure, an intersection point between the first multi-turning surface and the first main surface is away from the side surface by a first lateral distance, an intersection point between the first multi-turning surface and the side surface is away from the first main surface by a first vertical distance, and the first vertical distance is 0.5 times to 2 times the first lateral distance.

In an embodiment of the disclosure, the first vertical distance is equal to the first lateral distance.

Based on the above, in the electronic device of some embodiments of the disclosure, the side wire provided on the side surface of the substrate is utilized to serve as a signal transmission line, and in this manner, external electronic components (e.g., a circuit board) can be bonded to a surface other than the main surface. Accordingly, functional electronic components (e.g., a display element, a touch element, a sensing element, etc.) can be provided on most area of the main surface of the substrate in the electronic device, and these functional electronic components can even be disposed close to the edge of the substrate. Therefore, the electronic device may have a design with a narrow bezel or even almost no bezel. In addition, the substrate of the electronic device may have a multi-turning surface, so that the side wire can extend continuously from the main surface across the multi-turning surface to the side surface to ensure the continuity of the side wire.

BRIEF DESCRIPTION OF THE DRAWINGS

FIG. 7 is a schematic sectional view of the electronic device taken along line III-III in

FIG. 4.

DESCRIPTION OF THE EMBODIMENTS

Figure 1:
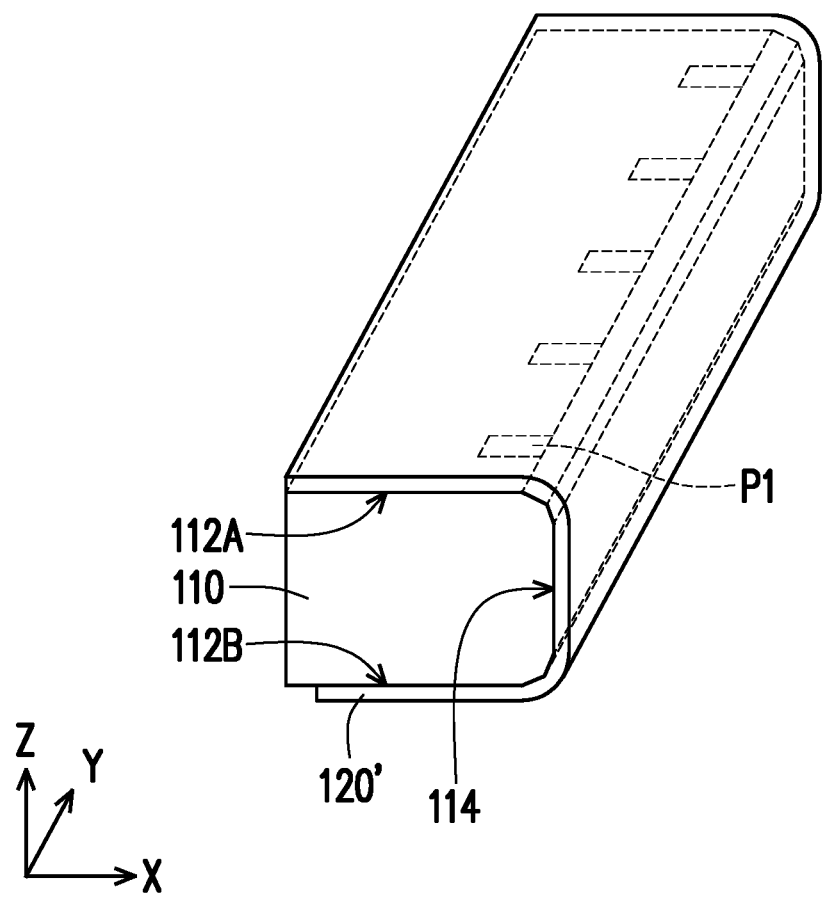
FIG. 1 to FIG. 4 show partial steps of manufacturing an electronic device according to some embodiments of the disclosure.

In the accompanying drawings, thicknesses of layers, films, panels, regions, etc. are exaggerated for clarity. Throughout the specification, the same reference numerals in the accompanying drawings denote the same devices. It is understood that when a device such as a layer, film, region, or substrate is referred to as being "on", "connected to", or "overlapping with" another device, it may be directly on or connected to another device, or intervening devices may also be present. In contrast, when a device is referred to as being "directly on" or "directly connected to" another device, no intervening devices are present. As used herein, the term "connected" may refer to physical connection and/or electrical connection. Also, the term "electrically connected" or "coupled" covers the case where other devices are present between the two devices.

It is noted that although the terms "first", "second", "third", etc. may be used for describing various elements, components, regions, layers, and/or portions, the elements, components, regions, layers, and/or portions are not limited by these terms. These terms are only used for distinguishing one element, component, region, layer, or portion from another element, component, region, layer, or portion. Therefore, a "first element", "component", "region", "layer", or "portion" discussed below may also be referred to as a second element, component, region, layer, or portion without departing from the scope of the disclosure.

The terminology used herein is only for the purpose of describing specific embodiments and is not intended to be restrictive. As used herein, the singular forms "a", "an", and "the" are intended to cover the plural forms including "at least one" as well, unless the context clearly indicates otherwise. The term "or" represents "and/or". The term "and/or" used herein includes any one or all combinations of one or more of the relevant listed items. It will be further understood that the terms "comprise" and/or "include", when used herein, specifies the presence of the specified features, regions, entirety, steps, operations, elements, and/or components, but do not exclude the presence or addition of one or more other features, regions, entireties, steps, operations, elements, components, and/or combinations thereof.

Moreover, relative terms such as "below" or "bottom" and "above" or "top" may serve to describe the relation between one component and another component herein as shown in the drawings. It is also understood that the relative terms are intended to include different orientations of a device in addition to the orientation shown in the drawings. For example, if a device in a drawing is turned upside down, a component described as being on the "lower" side of another component shall be re-orientated to be on the "upper" side of the another component. Thus, the exemplary term "lower" may include the orientations of "lower" and "upper", depending on the specific orientation of the drawings. Similarly, if a device in a drawing is turned upside down, a component described to be "under" or "below" another component shall be re-oriented to be "above" the another component. Therefore, the exemplary term "under" or "below" may include orientations of "above" and "below".

The term "about", "substantially", "close", or "similar" as used herein is inclusive of the stated value and a mean within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±10%, or ±5% of the stated value. Moreover, a relatively acceptable range of deviation or standard deviation may be chosen for the term "about," "substantially", "close", or "similar" as used herein based on optical properties, etching properties, or other properties, instead of applying one standard deviation across all the properties.

Unless otherwise defined, all terms (including technical and scientific terms) used herein have the same meaning as commonly understood by people of ordinary skill in the art. It will be further understood that terms, such as those defined in the commonly used dictionaries, should be interpreted as having meanings that are consistent with their meanings in the context of the relevant art and the disclosure and will not be interpreted in an idealized or overly formal sense unless expressly so defined herein.

Exemplary embodiments will be described herein with reference to schematic sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shapes of the regions, and are not intended to limit the scope of the claims.

For the convenience of description, the drawings referred to below show the orientation of components presented in each drawing with reference to an X direction, a Y direction, and a Z direction. The X direction, the Y direction, and the Z direction may be orthogonal to each other, or may intersect each other in a non-orthogonal manner.

FIG. 1 to FIG. 4 show partial steps of manufacturing an electronic device according to some embodiments of the disclosure. In FIG. 1, a first conductive pad P1 and a second conductive pad (not shown in FIG. 1) are formed on a substrate 110 in advance, and a conductive material layer 120' is formed on the substrate 110. The substrate 110 is a plate having a mechanical strength sufficient for carrying objects, and is provided for multiple film layers and/or multiple objects to be disposed thereon. In some embodiments, the material of the substrate 110 includes glass, polymer material, ceramic, etc. In other embodiments, the substrate 110 may be a multi-layer substrate formed by stacking multiple sub-layers. The substrate 110 has a first main surface 112A, a second main surface 112B, and a side surface 114. In FIG. 1, the number of the first conductive pads P1 is plural, and the first conductive pads P1 may be arranged along a Y direction. The first conductive pad P1 is located on the first main surface 112A, and the second conductive pad (not shown in FIG. 1) may be located on the second main surface 112B.

The conductive material layer 120' may cover the first conductive pad P1 on the first main surface 112A of the substrate 110, and may continuously extend from the first main surface 112A across the side surface 114 to the second main surface 112B. The conductive material layer 120' may be formed on the substrate 110 by edge sputtering. The material of the conductive material layer 120' includes copper, aluminum, molybdenum, silver, gold, nickel, titanium, ITO, IGZO, etc. The conductive material layer 120' may be in contact with and directly cover the first conductive pad P1. When the second main surface 112B is provided with a pad (e.g., the second conductive pad, which is not shown) thereon, the conductive material layer 120' may be in contact with and directly cover the second conductive pad on the second main surface 112B.

Figure 2:
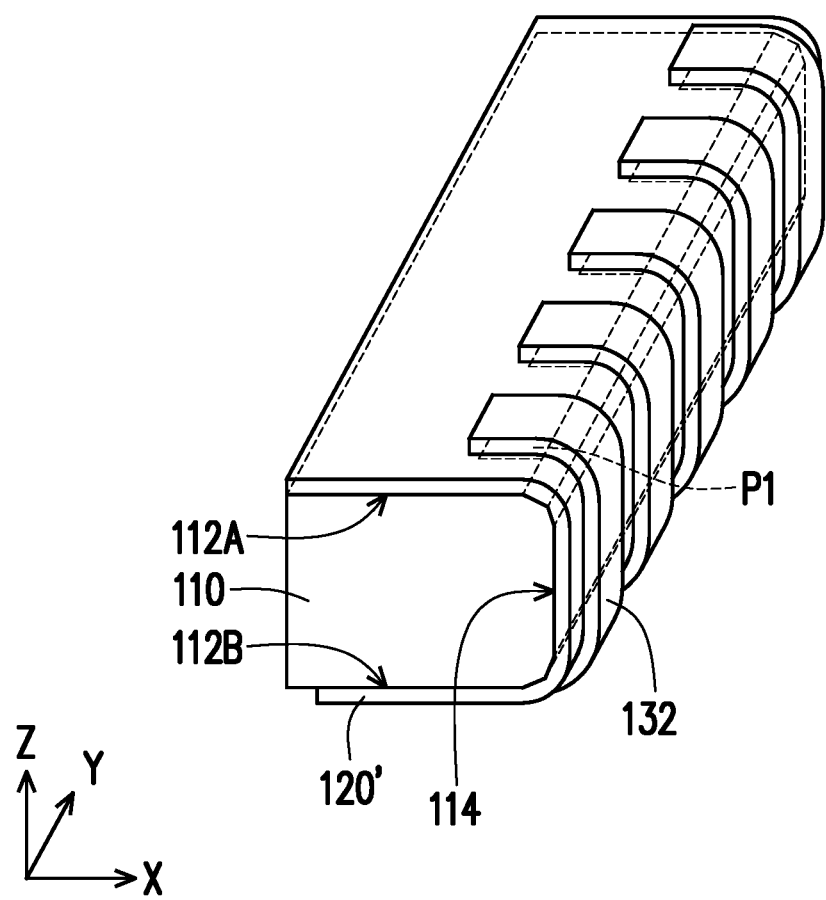

In FIG. 2, a first protective layer 132 is formed on the substrate 110. The first protective layer 132 may have a strip pattern, and the first protective layer 132 may continuously extend from the first main surface 112A across the side surface 114 to the second main surface 112B. As shown in FIG. 2, multiple strip-shaped first protective layers 132 may be arranged along the Y direction, and the strip-shaped first protective layers 132 may be disposed corresponding to the first conductive pad P1. In some embodiments, the first protective layer 132 may be fabricated on the substrate 110 by printing. For example, in some production processes, a protective layer material may be coated or applied on a printing tool, and then the printing tool is pressed against the side surface 114 of the substrate 110, so that the protective layer material on the printing tool is attached onto the conductive material layer 120'. Then, after the printing tool is removed, a curing step may be performed on the protective layer material attached onto the conductive material layer 120' to form the first protective layer 132.

Figure 3:
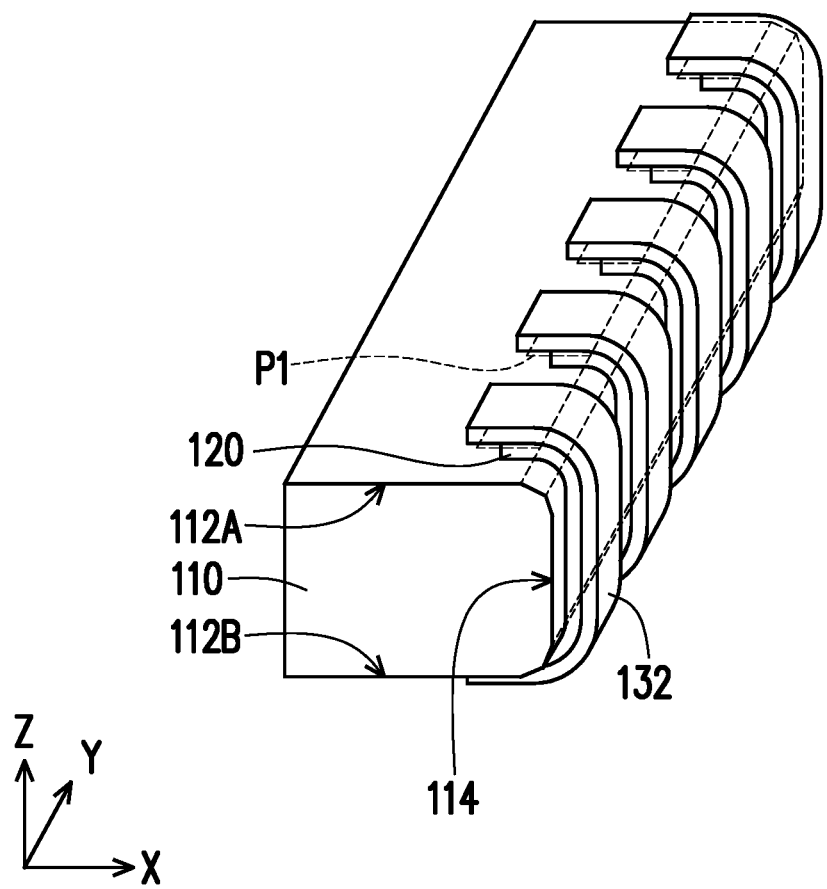

After the fabrication of the first protective layer 132 in FIG. 2 is completed, a patterning step may be performed to remove the portion of the conductive material layer 120' that is not covered by the first protective layer 132, to thereby form a side wire 120 shown in FIG. 3. The method of patterning the conductive material layer 120' may include isotropic etching. For example, the patterning step may include contacting the portion of the conductive material layer 120' not covered by the first protective layer 132 with an etchant. Here, the etchant for patterning the conductive material layer 120' has selectivity with respect to the conductive material layer 120' and the first protective layer 132. In other words, the etchant adopted in the patterning step is unlikely to, or does not, react with the material of the first protective layer 132, for example, so the first protective layer 132 is substantially not damaged in the etching step and may serve as a hard mask.

The side wire 120 is disposed on the substrate 110 and corresponds to the first protective layer 132. The number of the side wires 120 may be the same as the number of the first protective layers 132. Each of the side wires 120 is sandwiched between one of the strip-shaped first protective layers 132 and the substrate 110, and continuously extends from the first main surface 112A of the substrate plate 110 across the side surface 114 of the substrate 110 to the second main surface 112B of the substrate 110.

Figure 4:
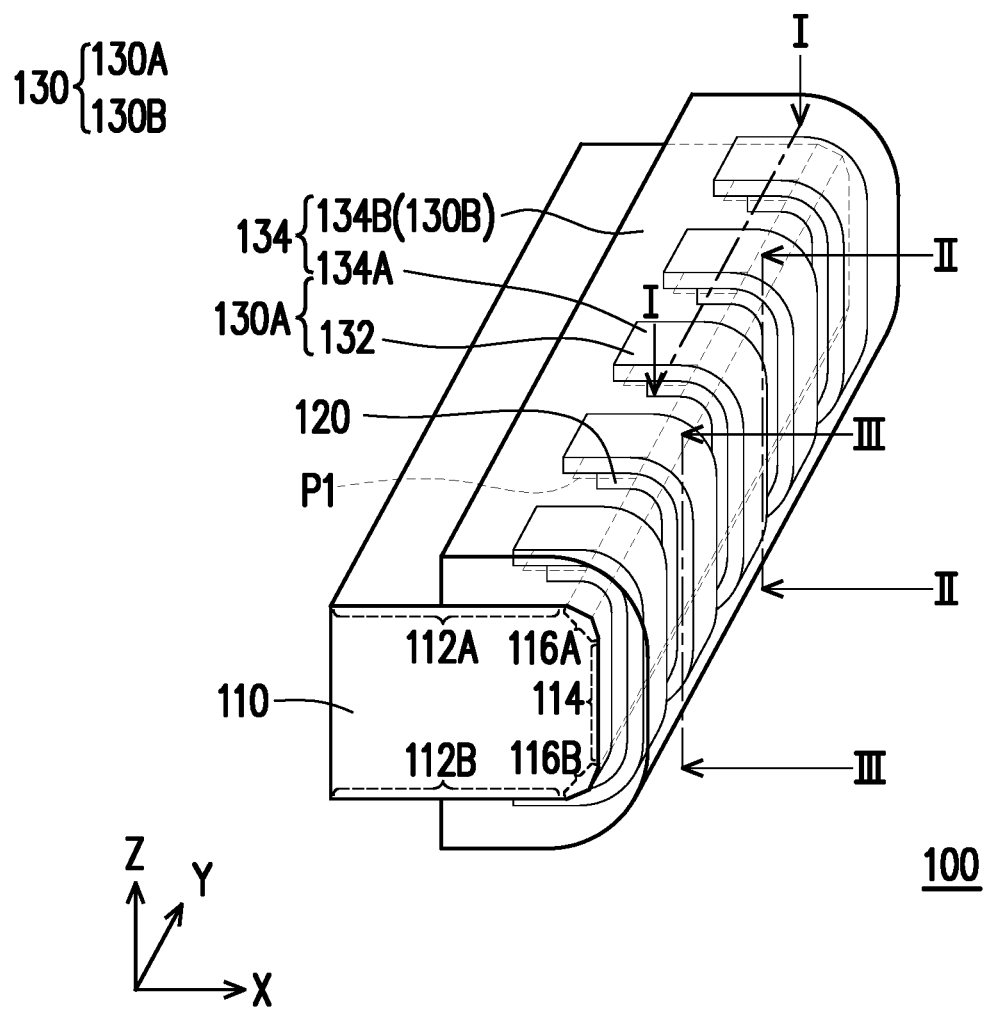

Next, as shown in FIG. 4, a second protective layer 134 is further formed on the structure of FIG. 3 to complete the electronic device 100. The second protective layer 134 is disposed on the substrate 110 and covers the first protective layer 132. The second protective layer 134 may be fabricated by printing (e.g., transfer printing) or wetting. For example, the fabrication method of the second protective layer 134 may include wetting the substrate 110 in a solution of a protective material, so that the protective material is attached to the substrate 110. After the protective material is cured, the second protective layer 134 is formed. The first protective layer 132 and the second protective layer 134 may form a protection structure 130 for protecting the side wire 120.

The materials of the first protective layer 132 and the second protective layer 134 may include polyester resins, phenolic resins, alkyd resins, polycarbonate resins, polyamide resins, polyurethane resins, silicone resins, epoxy resins, polyethylene resins, acrylic resins, polystyrene resins, polypropylene resins, or other materials providing waterproofing and protective effects. The first protective layer 132 and the second protective layer 134 may be formed of the same material or different materials.

Figure 5:
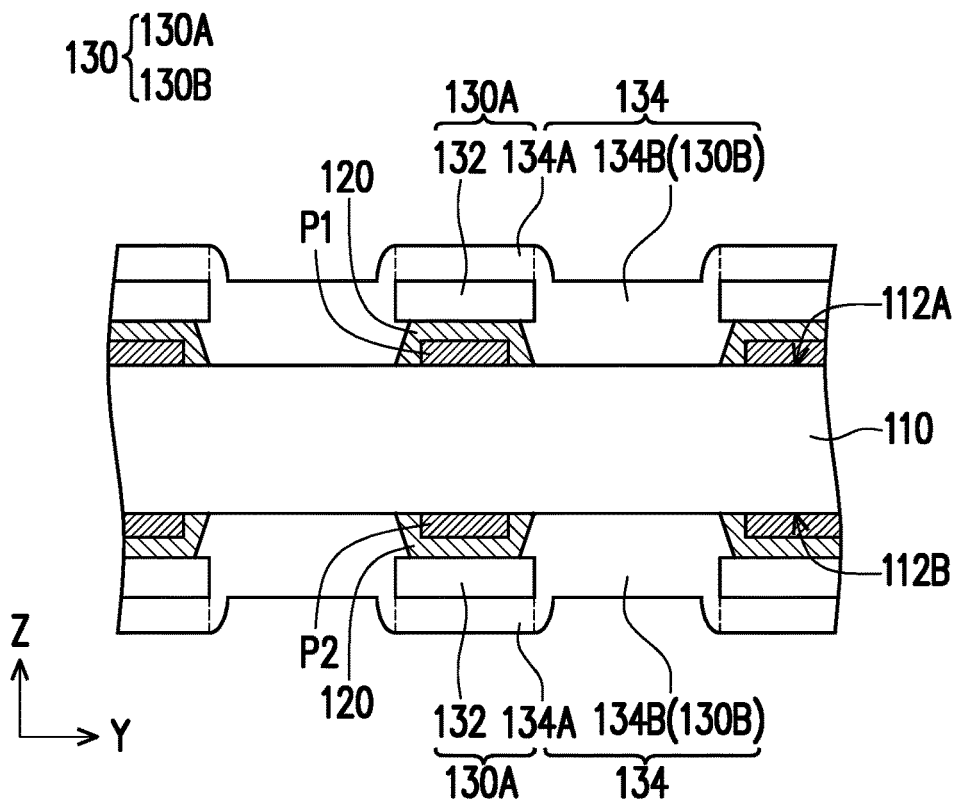
FIG. 5 is a schematic sectional view of the electronic device taken along line I-I in FIG. 4.

FIG. 4 is a schematic partial view of an electronic device according to an embodiment of the disclosure. FIG. 5 is a schematic sectional view of the electronic device taken along line I-I in FIG. 4. In FIG. 4 and FIG. 5, the electronic device 100 includes a substrate 110, multiple side wires 120, and a protection structure 130, but is not limited thereto. In some embodiments, the electronic device 100 may further include other signal lines, other electronic components, etc. For example, in addition to the components shown in the figures, the electronic device 100 may further include a light-emitting element, a display element, a touch element, or a combination of the above elements. For example, as shown in FIG. 5, the electronic device 100 may further include a first conductive pad P1 and a second conductive pad P2. The first conductive pad P1 is disposed on the first main surface 112A of the substrate 110, and the second conductive pad P2 is disposed on the second main surface 112B of the substrate 110. Each of the side wires 120 is disposed corresponding to one of the first conductive pads P1, and one of the side wires 120 may electrically connect the first conductive pad P1 to the corresponding second conductive pad P2 to establish an electrical transmission path continuously extending from the first main surface 112A to the second main surface 112B.

In FIG. 4 to FIG. 5, the substrate 110 has, for example, the first main surface 112A, the second main surface 112B, and the side surface 114. In this embodiment, the normal directions of the first main surface 112A and the second main surface 112B may be, for example, parallel to a Z direction, and the normal direction of the side surface 114 may be parallel to an X direction. In other words, the normal direction of the first main surface 112A may intersect the normal direction of the side surface 114 and may be parallel to the normal direction of the second main surface 112B, but the disclosure is not limited thereto.

Figure 6:
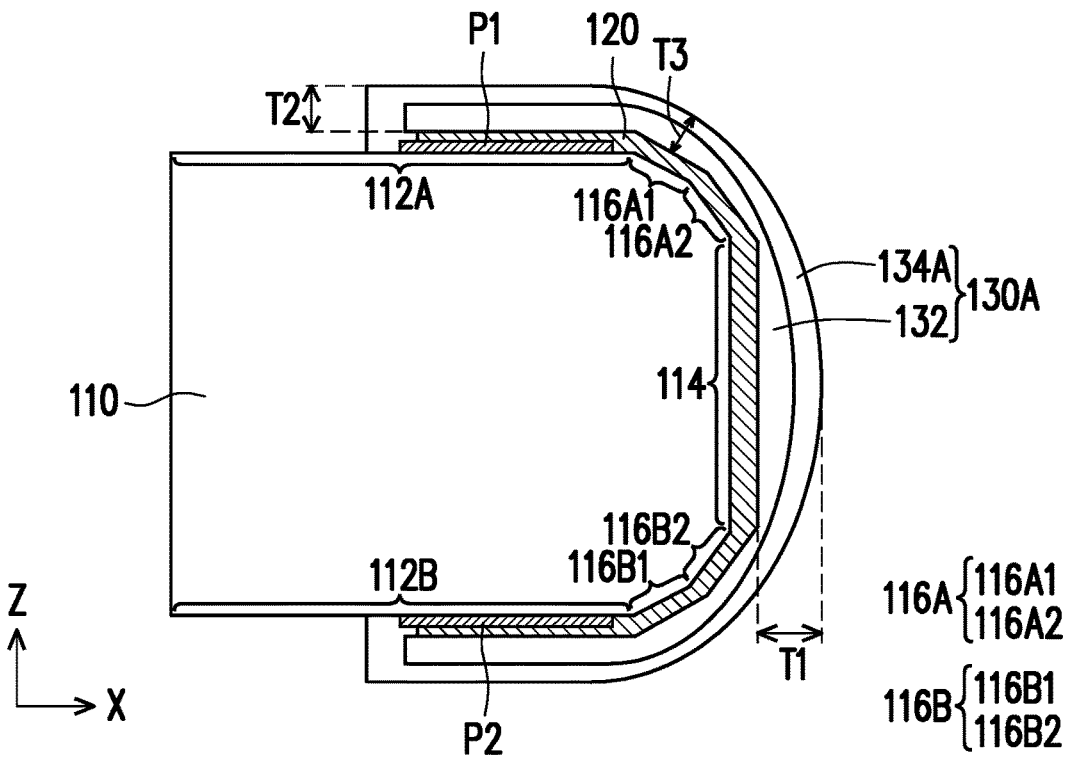
FIG. 6 is a schematic sectional view of the electronic device taken along line II-II in FIG. 4.
Figure 7:
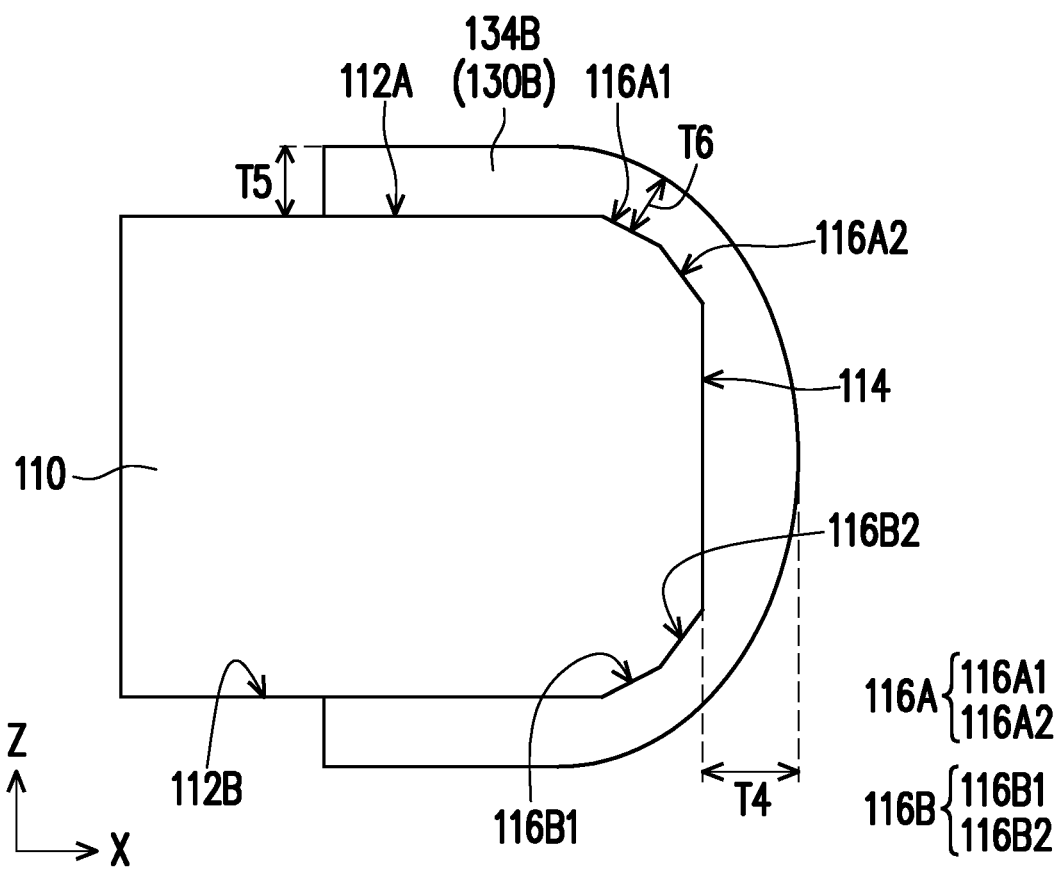

FIG. 6 is a schematic sectional view of the electronic device taken along line II-II in FIG. 4, and FIG. 7 is a schematic sectional view of the electronic device taken along line III-III in FIG. 4. The substrate 110 may be cut into a required size. In addition, the turning corner between the first main surface 112A and the side surface 114 may be chamfered so that the substrate 110 has a first multi-turning surface 116A. The first multi-turning surface 116A is connected between the first main surface 112A and the side surface 114. The normal direction of the first multi-turning surface 116A may be between the normal direction of the first main surface 112A and the normal direction of the side surface 114.

In FIG. 6 and FIG. 7, the first multi-turning surface 116A may be formed by two chamfering processes. For example, the first multi-turning surface 116A may include two first turning surfaces 116A1 and 116A2. The first turning surface 116A1 is connected between the first turning surface 116A2 and the first main surface 112A, and the first turning surface 116A2 is connected between the first turning surface 116A1 and the side surface 114. In other embodiments, the first multi-turning surface 116A may selectively have three or more turning surfaces.

Similarly, the turning corner between the second main surface 112B and the side surface 114 may be chamfered so that the substrate 110 has a second multi-turning surface 116B. The second multi-turning surface 116B is connected between the second main surface 112B and the side surface 114 and may be formed of a second turning surface 116B1 and a second turning surface 116B2, but the disclosure is not limited thereto. In other embodiments, the turning corner between the second main surface 112B and the side surface 114 may be selectively unchamfered, but the disclosure is not limited thereto. The normal direction of the second multi-turning surface 116B may be between the normal direction of the second main surface 112B and the normal direction of the side surface 114.

The first multi-turning surface 116A is connected between the first main surface 112A and the side surface 114, and the second multi-turning surface 116B is connected between the second main surface 112B and the side surface 114, so that the turning corners between the adjacent surfaces can have obtuse angles. Accordingly, any film layer and/or component that extends across adjacent surfaces can have better continuity and do not easily break at the turning corners. Therefore, the quality of the electronic device 100 can be ensured.

As shown in FIG. 4, FIG. 5, and FIG. 6, the side wires 120 are disposed on the substrate 110, and each of the side wires 120 extends from the first main surface 112A across the first multi-turning surface 116A to the side surface 114. According to the design requirements, each of the side wires 120 may further extend from the side surface 114 across the second multi-turning surface 116B to the second main surface 112B. With the first multi-turning surface 116A and the second multi-turning surface 116B, the turning corners between the adjacent surfaces have obtuse angles, so the side wire 120 can continuously extend from the first main surface 112A, pass across the first multi-turning surface 116A, the side surface 114, and the second multi-turning surface 116B, and then reach the second main surface 112B. In other words, the side wire 120 has good continuity between the surfaces of different normal vectors, which helps to ensure the quality of electrical signal transmission of the side wire 120.

The protection structure 130 is disposed on the substrate 110 and includes a wire protection part 130A covering the side wires 120 and a gap protection part 130B extending between the side wires 120. In this embodiment, the wire protection part 130A refers to the portion of the protection structure 130 that overlaps with the side wire 120, and the gap protection part 130B refers to the portion of the protection structure 130 that extends in a gap G120 of the side wire 120. In other words, the wire protection part 130A and the gap protection part 130B are distinguished by their distribution positions.

Specifically, the protection structure 130 may be formed by stacking a first protective layer 132 and a second protective layer 134. The first protective layer 132 has multiple strip-patterned protective layers. Each strip pattern of the first protective layer 132 is disposed corresponding to one of the side wires 120 to cover the side wire 120. As shown in FIG. 4 and FIG. 5, the contour of the side wire 120 conforms to the contour of the first protective layer 132, and the first protective layer 132 correspondingly covers each of the side wires 120. The second protective layer 134 continuously covers the side wires 120 and the gap G120 between the side wires 120. The second protective layer 134 may cover the first protective layer 132 and fully cover the first protective layer 132 and the side wire 120 but is not limited thereto.

In some embodiments, the first protective layer 132 and the second protective layer 134 may have the same material, so there is no obvious boundary between the first protective layer 132 and the second protective layer 134. In other embodiments, the first protective layer 132 and the second protective layer 134 may have different materials, and there is an obvious boundary between the two. In addition, the second protective layer 134 may include an overlapping segment 134A and a gap segment 134B. The overlapping segment 134A is stacked on the first protective layer 132 and forms the wire protection part 130A with the first protective layer 132. The gap segment 134B is located in the gap G120 between the side wires 120 and is in contact with the substrate 110 to form the gap protection part 130B of the protection structure 130.

Referring to FIG. 6, the wire protection part 130A of the protection structure 130 is mainly composed of the first protective layer 132 and the overlapping segment 134A stacked on the first protective layer 132. The wire protection part 130A has a first thickness T1 at the side surface 114, has a second thickness T2 at the first main surface 112A, and has a third thickness T3 at the first turning surface 116A1. The first thickness T1 is greater than the second thickness T2, and the second thickness T2 is greater than the third thickness T3.

Referring to FIG. 4 and FIG. 7, the gap protection part 130B extending between the side wires 120 is mainly formed of the gap segment 134B of the second protective layer 134, and the gap segment 134B may be in contact with the substrate 110 without a wire sandwiched between the substrate 110 and the gap segment 134B. The gap protection part 130B has a fourth thickness T4 at the side surface 114, has a fifth thickness T5 at the first main surface 112A, and has a sixth thickness T6 at the first turning surface 116A1. The fourth thickness T4 is greater than the fifth thickness T5, and the fifth thickness T5 is greater than the sixth thickness T6. Referring to FIG. 5 and FIG. 6 at the same time, in some embodiments, the second thickness T2 may be greater than the fifth thickness T5. In other embodiments, the second thickness T2 may be greater than the fourth thickness T4. In still other embodiments, the third thickness T3 is greater than the sixth thickness T6.

Figure 8:
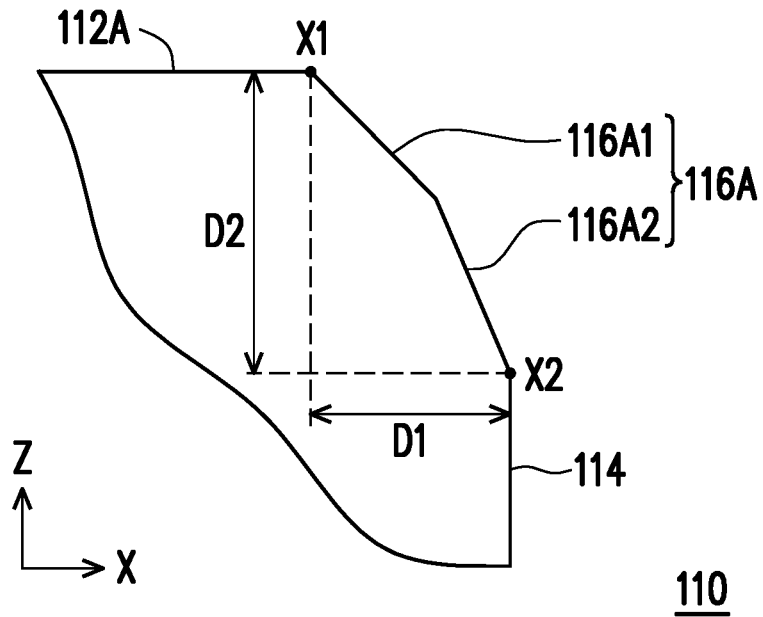
FIG. 8 a schematic partial sectional view showing a substrate according to an embodiment of the disclosure.

FIG. 8 is a schematic partial sectional view showing a substrate according to an embodiment of the disclosure. FIG. 8 is a schematic partial enlarged view showing the first multi-turning surface 116A of the substrate 110. The normal direction of the first main surface 112A of the substrate 110 is, for example, parallel to the Z direction, and the normal direction of the side surface 114 is, for example, parallel to the X direction. The first multi-turning surface 116A may include two first turning surfaces 116A1 and 116A2. In this embodiment, the normal directions of the first turning surface 116A1 and the first turning surface 116A2 may both be between the Z direction and the X direction. Specifically, the normal direction of the first turning surface 116A1 is between the normal direction of the first main surface 112A and the normal direction of the first turning surface 116A2, and the normal direction of the first turning surface 116A2 is between the normal direction of the first turning surface 116A1 and the normal direction of the side surface 114. The intersection angle between the normal direction of the first main surface 112A and the normal direction of the first turning surface 116A1, the intersection angle between the normal direction of the first turning surface 116A1 and the normal direction of the first turning surface 116A2, and the intersection angle between the normal direction of the first turning surface 116A2 and the normal direction of the side surface 114 may be equal to or close to each other.

In some embodiments, an intersection point X1 between the first multi-turning surface 116A and the first main surface 112A is away from the side surface 114 by a first lateral distance D1, an intersection point X2 between the first multi-turning surface 116A and the side surface 114 is away from the first main surface 112A by a first vertical distance D2, and the first vertical distance D2 may substantially be 0.5 times to 2 times the first lateral distance D1. In some embodiments, the first vertical distance D2 may be substantially equal to the first lateral distance D1. Herein, the lateral distance refers to a distance measured parallel to the X direction, and the vertical distance refers to a distance measured parallel to the Z direction. The relationship between the first lateral distance D1 and the first vertical distance D2 described here may apply to all the embodiments in this specification and is not particularly limited.

Figure 9:
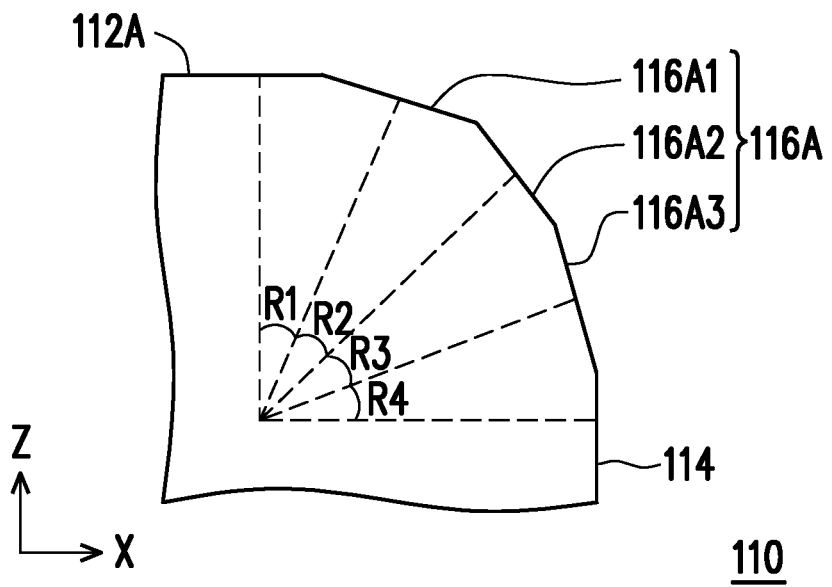
FIG. 9 is a schematic partial sectional view showing a substrate according to another embodiment of the disclosure.

FIG. 9 is a schematic partial sectional view showing a substrate according to another embodiment of the disclosure, and FIG. 9 shows a partial structure of the first multi-turning surface 116A of the substrate 110. The normal direction of the first main surface 112A of the substrate 110 is, for example, parallel to the Z direction, and the normal direction of the side surface 114 is, for example, parallel to the X direction. The first multi-turning surface 116A may include three first turning surfaces 116A1, 116A2, and 116A3. In this embodiment, the normal directions of the first turning surface 116A1, the first turning surface 116A2, and the first turning surface 116A3 may all be between the Z direction and the X direction. An intersection angle R1 between the normal direction of the first main surface 112A and the normal direction of the first turning surface 116A1, an intersection angle R2 between the normal direction of the first turning surface 116A1 and the normal direction of the first turning surface 116A2, an intersection angle R3 between the normal direction of the first turning surface 116A2 and the normal direction of the first turning surface 116A3, and an intersection angle R4 between the normal direction of the first turning surface 116A3 and the normal direction of the side surface 114 may be equal to or close to each other.

Figure 10:
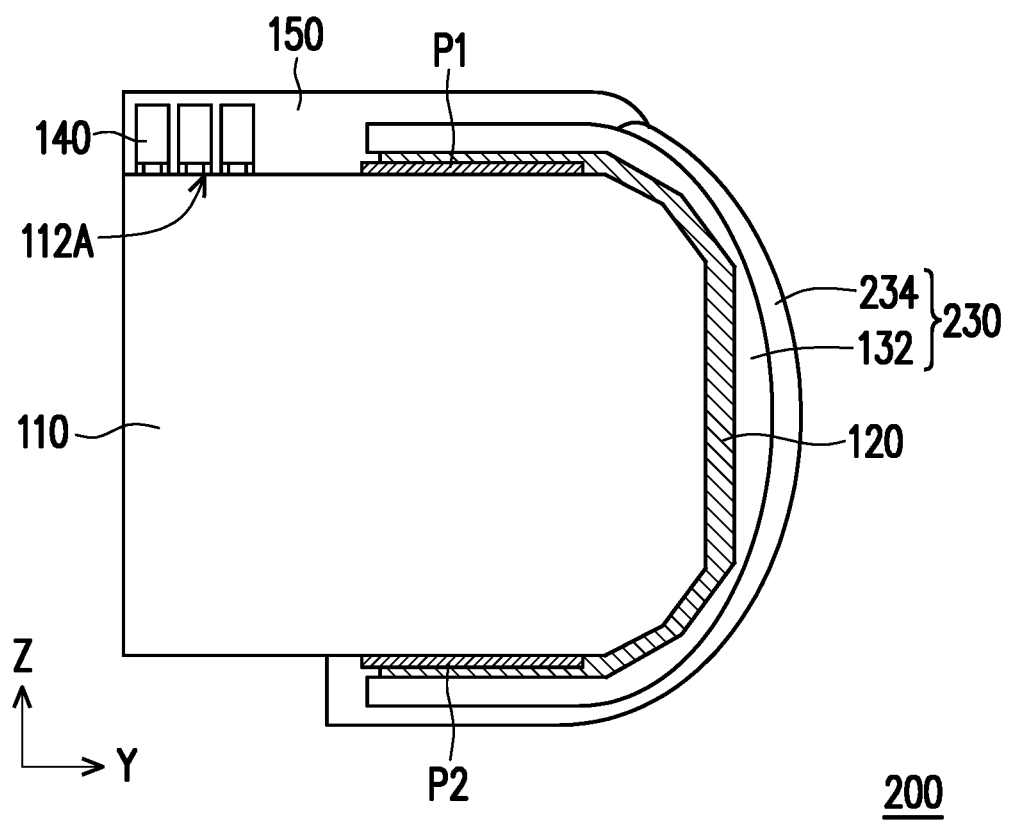
FIG. 10 is a schematic partial sectional view of an electronic device according to another embodiment of the disclosure.

FIG. 10 is a schematic partial sectional view of an electronic device according to another embodiment of the disclosure. An electronic device 200 of FIG. 10 includes a substrate 110, a side wire 120, a protection structure 230, a light-emitting element 140, and an encapsulation layer 150. The protection structure 230 is formed by stacking a first protective layer 132 and a second protective layer 234, for example. The substrate 110, the side wire 120, and the first protective layer 132 described in this embodiment are substantially the same as the corresponding components in the above embodiment. Therefore, the descriptions of the substrate 110, the side wire 120, and the first protective layer 132 in the above embodiment may all apply to this embodiment and shall not be repeated herein. In addition, the light-emitting element 140 and the encapsulation layer 150 shown in FIG. 10 may apply to other embodiments in this specification.

In this embodiment, the light-emitting element 140 may be disposed on the first main surface 112A of the substrate 110 and spaced apart from the protection structure 230. In other words, the light-emitting element 140 is not in contact with the protection structure 230. In some embodiments, the light-emitting element 140 includes a light-emitting diode device but is not limited thereto. The number of the light-emitting elements 140 is, for example, plural, and the light-emitting elements 140 may emit lights of different colors. The light-emitting element 140 may be electrically connected to the corresponding first conductive pad P1 via a circuit structure fabricated on the substrate 110. Here, the side wire 120, the first conductive pad P1, and the second conductive pad P2 may all be used to transmit electrical signals required by the light-emitting element 140.

The encapsulation layer 150 may be disposed on the first main surface 112A of the substrate 110 to cover the light-emitting element 140. In addition, the second protective layer 234 of this embodiment is substantially similar to the second protective layer 134 of the above embodiment, and reference may be made to the descriptions of the second protective layer 134 for descriptions of the material and configuration of the second protective layer 234. However, the second protective layer 234 of this embodiment exposes the portion of the first protective layer 132 on the first main surface 112A. In other words, the portion of the first protective layer 132 on the first main surface 112A is not fully covered by the second protective layer 234. In addition, the encapsulation layer 150 may further overlap with a portion of the protection structure 230 on the first main surface 112A and even cover a portion of the second protective layer 234. Accordingly, the first protective layer 132 may be fully sealed by the second protective layer 234 and the encapsulation layer 150.

Figure 11:
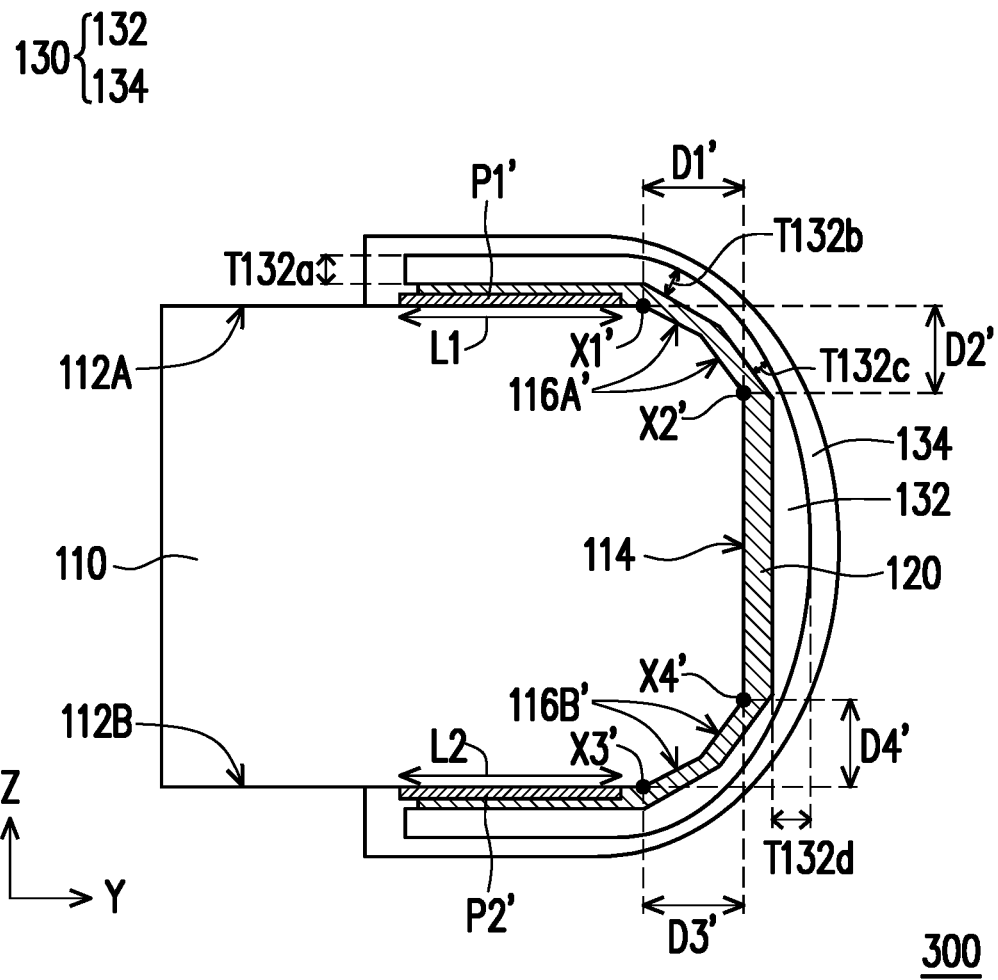
FIG. 11 is a schematic partial sectional view of an electronic device according to another embodiment of the disclosure.

FIG. 11 is a schematic partial sectional view of an electronic device according to another embodiment of the disclosure. An electronic device 300 of FIG. 11 includes a substrate 110, a side wire 120, and a protection structure 130. Reference may be made to the above embodiment for descriptions of the relative configurations and fabrication methods of the substrate 110, the side wire 120, and the protection structure 130. The components shown in FIG. 11 are substantially similar to the components shown in FIG. 4, so the differences between the two embodiments will be mainly described below. The components labeled with the same reference numerals in FIG. 4 and FIG. 11 may be configured in the same manner.

In FIG. 11, the first main surface 112A and the second main surface 112B are, for example, opposite surfaces of the substrate 110. A first multi-turning surface 116A' is provided between the first main surface 112A and the side surface 114 of the substrate 110, and a second multi-turning surface 116B' is provided between the second main surface 112B and the side surface 114 of the substrate 110. One of the differences between this embodiment and the embodiment in FIG. 4 lies in the extending lengths of the first multi-turning surface 116A' and the second multi-turning surface 116B'. Specifically, an intersection point X1' between the first multi-turning surface 116A' and the first main surface 112A is away from the side surface 114 by a first lateral distance D1', and an intersection point X2' between the first multi-turning surface 116A' and the side surface 114 is away from the first main surface 112A' by a first vertical distance D2'. An intersection point X3' between the second multi-turning surface 116B' and the second main surface 112B is away from the side surface 114 by a second lateral distance D3', and an intersection point X4' between the second multi-turning surface 116B' and the side surface 114 is away from the second main surface 112B by a second vertical distance D4'. In this embodiment, the first lateral distance D1' may be less than the second lateral distance D3', and the first vertical distance D2' may be less than the second vertical distance D4'. In some embodiments, a design in which the first lateral distance D1' is less than the second lateral distance D3' and the first vertical distance D2' is equal to the second vertical distance D4' may be adopted, or a design in which the first lateral distance D1' is equal to the second lateral distance D3' and the first vertical distance D2' is less than the second vertical distance D4' may be adopted. In other words, the first multi-turning surface 116A' and the second multi-turning surface 116B' may have different extending lengths.

In some embodiments, the first multi-turning surface 116A' and the second multi-turning surface 116B' may have different extending lengths, but the lengths of the first multi-turning surface 116A' in the Z direction and the X direction may be equal, and the lengths of the second multi-turning surface 116B' in the Z direction and the X direction may be equal. For example, the first vertical distance D2' may be substantially equal to the first lateral distance D1', and the second vertical distance D4' may be substantially equal to the second lateral distance D3'. In some embodiments, the first vertical distance D2' may substantially be 0.5 times to 2 times the first lateral distance D1', and similarly, the second vertical distance D4' may substantially be 0.5 times to 2 times the second lateral distance D3'. In addition, as an example, the first multi-turning surface 116A' and the second multi-turning surface 116B' are each described here to include two turning surfaces, but the number of turning surfaces of each of the first multi-turning surface 116A' and the second multi-turning surface 116B' may be adjusted depending on the design.

In some embodiments, the substrate 110 may be provided with a first conductive pad P1' and a second conductive pad P2', and the side wire 120 is in contact with the first conductive pad P1' and the second conductive pad P2' to electrically connect the first conductive pad P1' and the second conductive pad P2' to each other. The first conductive pad P1' is disposed on the first main surface 112A of the substrate 110, the second conductive pad P2' is disposed on the second main surface 112B of the substrate 110, and the second conductive pad P2' may be farther from the side surface 114 in the X direction than the first conductive pad P1'. A length L1' of the first conductive pad P1' in the X direction may be less than a length L2 of the second conductive pad P2' in the X direction.

In addition, in the electronic device 300, the protection structure 130 covering the side wire 120 may be formed by stacking a first protective layer 132 and a second protective layer 134. In an embodiment in which the first protective layer 132 and the second protective layer 134 are formed of different materials, there may be an obvious boundary between the first protective layer 132 and the second protective layer 134. In an embodiment in which the first protective layer 132 and the second protective layer 134 are formed of the same material, there is no obvious boundary between the first protective layer 132 and the second protective layer 134, so that the protection structure 130 may be substantially regarded as an integral structure.

In some embodiments, the first protective layer 132 may have a varying thickness. The thickness described below refers to the dimension of the first protective layer 132 measured in the normal direction of the surface on which the first protective layer 132 is located. For example, the first protective layer 132 has a thickness $T132a$ at the first main surface 112A, has thicknesses $T132b$ and $T132c$ at the first multi-turning surface 116A', and has a thickness $T132d$ at the side surface 114. It is possible that the thickness $T132a$, the thickness $T132b$, the thickness $T132c$, and the thickness $T132d$ are not totally equal. In some embodiments, the thickness $T132d$ may be greater than each of the thickness $T132a$, the thickness $T132b$, and the thickness $T132c$, so the first protective layer 132 has the largest thickness at the side surface 114, but the disclosure is not limited thereto. In addition, the thickness $T132a$, the thickness $T132b$, and the thickness $T132c$ may be sequentially reduced. For example, the thickness $T132a$ is greater than the thickness $T132b$, and the thickness $T132b$ is greater than the thickness $T132c$, but the disclosure is not limited thereto. In some embodiments, the thickness of the first protective layer 132 on the second main surface 112B may be substantially similar to the thickness $T132a$, and the thicknesses on the second multi-turning surface 116B' may be substantially similar to the thickness $T132b$ and the thickness $T132c$.

In summary of the above, the electronic device of the embodiments of the disclosure has a turning corner with multiple turns, so the side wire distributed along the turning corner can have ideal continuity. In addition, with the design of the side wire, the electronic device can have an extremely narrow bezel, which helps to improve the application flexibility of the electronic device. Accordingly, the electronic device of the embodiments of the disclosure may be applied to products requiring an extremely narrow bezel or even no bezel, e.g., a spliced product.

What is claimed is:

1. An electronic device comprising:
   a substrate having a first main surface, a side surface, and a first multi-turning surface connected between the first main surface and the side surface, wherein the first multi-turning surface comprises a plurality of first turning surfaces with differing normal directions;

a plurality of side wires disposed on the substrate, wherein each of the side wires extends from the first main surface across the first multi-turning surface to the side surface; and a protection structure disposed on the substrate and comprising a wire protection part covering the side wires, wherein the wire protection part has a first thickness at the side surface, has a second thickness at the first main surface, and has a third thickness at at least one of the first turning surfaces, wherein the first thickness is greater than the second thickness, and the second thickness is greater than the third thickness.

2. The electronic device according to claim 1, wherein the protection structure further comprises a gap protection part extending between the side wires, and the gap protection part has a fourth thickness at the side surface, has a fifth thickness at the first main surface, and has a sixth thickness at at least one of the first turning surfaces, wherein the fourth thickness is greater than the fifth thickness, and the fifth thickness is greater than the sixth thickness.

3. The electronic device according to claim 2, wherein the second thickness is greater than the fifth thickness.

4. The electronic device according to claim 2, wherein the second thickness is greater than the fourth thickness.

5. The electronic device according to claim 1, wherein the protection structure is formed by stacking a first protective layer and a second protective layer, and the first protective layer is located between the side wires and the second protective layer.

6. The electronic device according to claim 5, wherein the first protective layer covers the side wires, and a contour of the side wires conforms to a contour of the first protective layer.

7. The electronic device according to claim 5, wherein the second protective layer comprises an overlapping segment and a gap segment, the overlapping segment is stacked on the first protective layer and forms the wire protection part with the first protective layer, and the gap segment is located in a gap between the side wires and is in contact with the substrate.

8. The electronic device according to claim 5, wherein the second protective layer exposes a portion of the first protective layer on the first main surface.

9. The electronic device according to claim 1, wherein the substrate further comprises a second main surface and a second multi-turning surface located between the second main surface and the side surface, and the second multi-turning surface comprises a plurality of second turning surfaces with differing normal directions.

10. The electronic device according to claim 9, wherein each of the side wires extends continuously from the first main surface, passing across the first multi-turning surface, the side surface, and the second multi-turning surface, to the second main surface.

11. The electronic device according to claim 9, wherein an intersection point between the first multi-turning surface and the first main surface is away from the side surface by a first lateral distance, an intersection point between the second multi-turning surface and the second main surface is away from the side surface by a second lateral distance, and the first lateral distance is less than the second lateral distance.

12. The electronic device according to claim 1, further comprising a first conductive pad and a second conductive pad respectively disposed on the first main surface and the second main surface, and one of the side wires electrically connects the first conductive pad to the second conductive pad.

13. The electronic device according to claim 12, wherein the second conductive pad is farther away from the side surface than the first conductive pad.

14. The electronic device according to claim 12, wherein a length of the first conductive pad is less than a length of the second conductive pad.

15. The electronic device according to claim 1, further comprising a light-emitting element disposed on the first main surface and spaced apart from the protection structure.

16. The electronic device according to claim 15, further comprising an encapsulation layer to cover the light-emitting element.

17. The electronic device according to claim 16, wherein the encapsulation layer further overlaps with a portion of the protection structure on the first main surface.

18. The electronic device according to claim 1, wherein the normal directions of the first turning surfaces are between a normal direction of the first main surface and a normal direction of the side surface.

19. The electronic device according to claim 1, wherein an intersection point between the first multi-turning surface and the first main surface is away from the side surface by a first lateral distance, an intersection point between the first multi-turning surface and the side surface is away from the first main surface by a first vertical distance, and the first vertical distance is 0.5 times to 2 times the first lateral distance.

20. The electronic device according to claim 19, wherein the first vertical distance is equal to the first lateral distance.

* * * * *